US012745351B2

(12) United States Patent
Parigot

(10) Patent No.: US 12,745,351 B2
(45) Date of Patent: Sep. 22, 2026

(54) ELECTRICAL EQUIPMENT

(71) Applicant: Valeo Electrification, Cergy Saint-Christophe (FR)

(72) Inventor: Baptiste Parigot, Cergy Pontoise (FR)

(73) Assignee: Valeo Electrification, Cergy Saint-Christophe (FR)

( * ) Notice: Subject to any disclaimer, the term of this patent is extended or adjusted under 35 U.S.C. 154(b) by 69 days.

(21) Appl. No.: 18/545,209

(22) Filed: Dec. 19, 2023

(65) Prior Publication Data

US 2024/0206073 A1 Jun. 20, 2024

(30) Foreign Application Priority Data

Dec. 19, 2022 (FR) ..................................... 22 13753

(51) Int. Cl.
*H05K 1/181* (2026.01)
*H05K 1/02* (2006.01)

(52) U.S. Cl.
CPC ........... *H05K 1/181* (2013.01); *H05K 1/0203* (2013.01); *H05K 2201/066* (2013.01); *H05K 2201/10606* (2013.01); *H05K 2201/10984* (2013.01)

(58) Field of Classification Search
CPC ...................................................... H05K 1/181
USPC .......................................................... 361/760
See application file for complete search history.

(56) References Cited

U.S. PATENT DOCUMENTS 5,648,889 A 7/1997 Bosli
7,242,593 B2 7/2007 Coutu
2002/0190667 A1* 12/2002 Ishikawa ................ F21V 29/85 315/307
2013/0083486 A1 4/2013 Heo
2023/0070930 A1* 3/2023 Gu ...................... H02M 1/4233

FOREIGN PATENT DOCUMENTS

EP 2 579 306 A2 4/2013
FR 3 097 095 A1 12/2020
JP 2012-160646 A 8/2012
JP 2012160646 * 8/2012

OTHER PUBLICATIONS

European Office Action issued Apr. 23, 2025 in European Patent Application No. 23217280.9, 5 pages.
French Preliminary Search Report and Written Opinion issued Jun. 26, 2023 in French Application 22 13753 filed on Dec. 19, 2022, 10 pages (with English Translation of Categories of Cited Documents).

* cited by examiner

*Primary Examiner* — Stanley Tso
(74) *Attorney, Agent, or Firm* — Oblon, McClelland, Maier & Neustadt, L.L.P.

(57) ABSTRACT

An item of electrical equipment includes an electronic board, an electronic component fixed onto the electronic board and disposed parallel to the electronic board, and a heat sink configured to dissipate the heat emitted by the electronic component. A retention member supports a bearing element which presses onto the electronic component in a direction orthogonal to the electronic board and in a direction away from the electronic component relative to the electronic board. The bearing element is configured to press the electronic components onto the heat sink.

20 Claims, 3 Drawing Sheets

[Fig. 1]
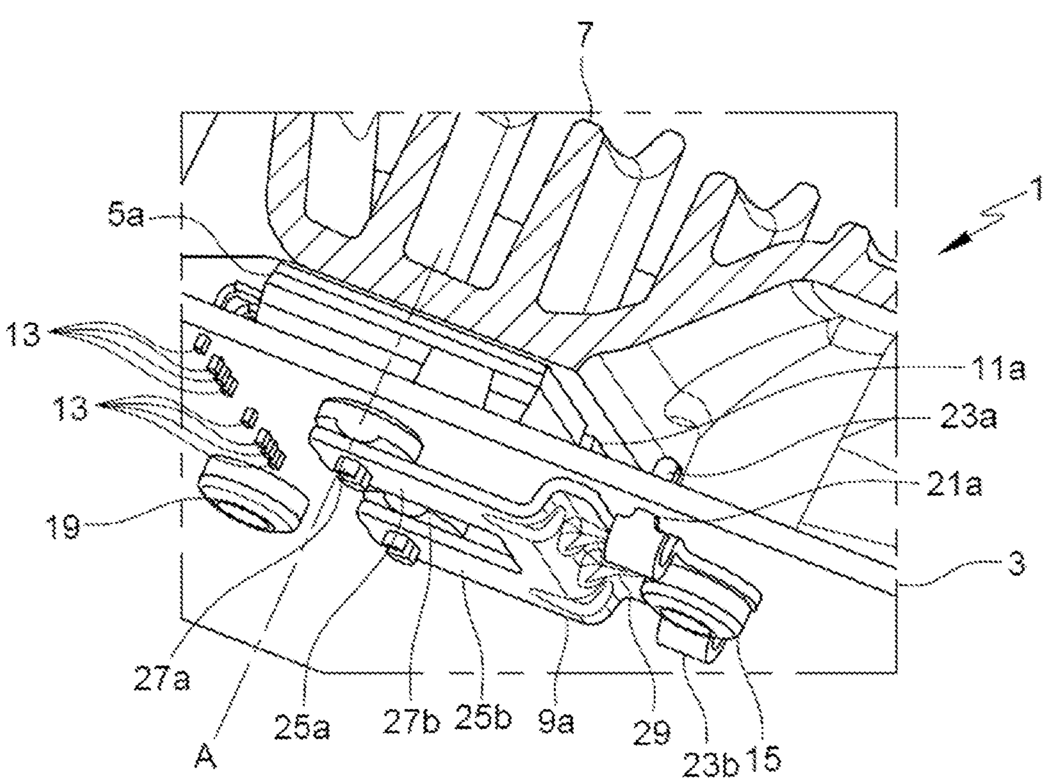
[Fig. 2]
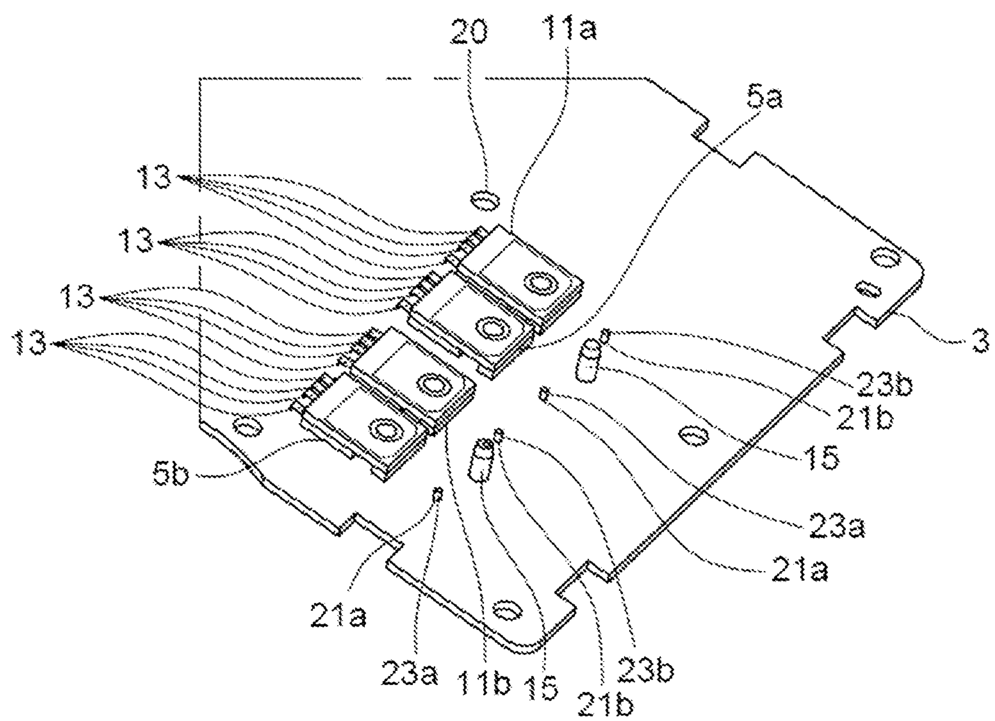

[Fig. 3]
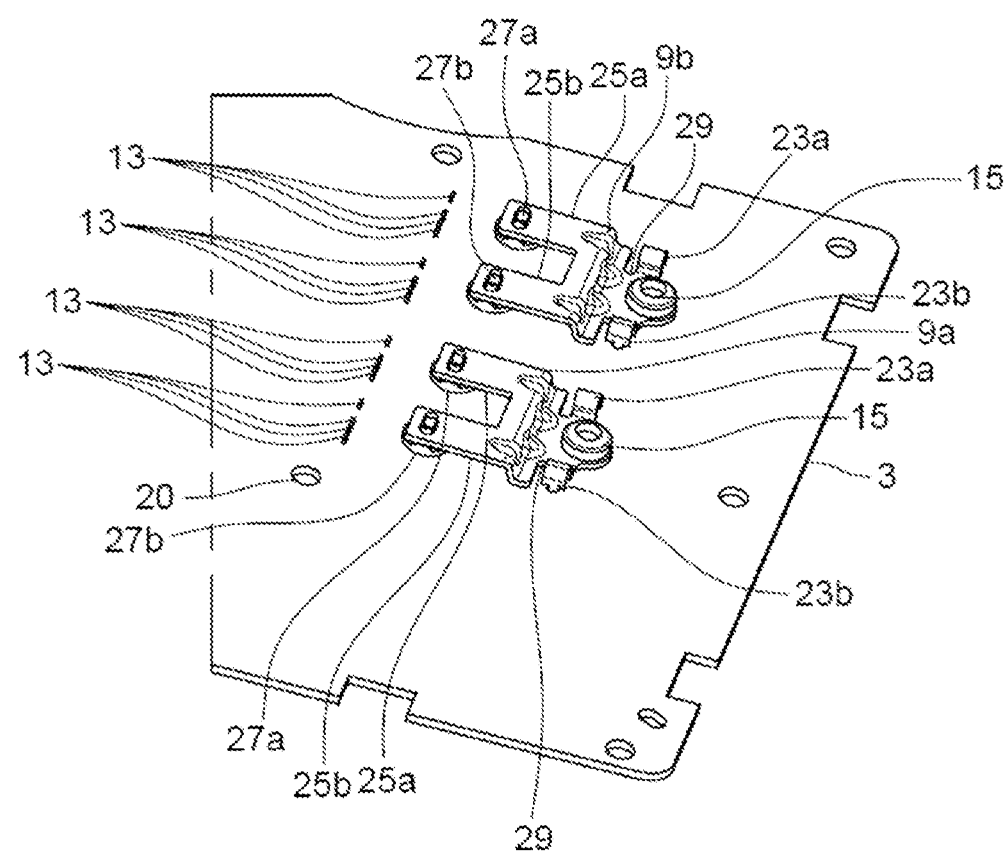
[Fig. 4]
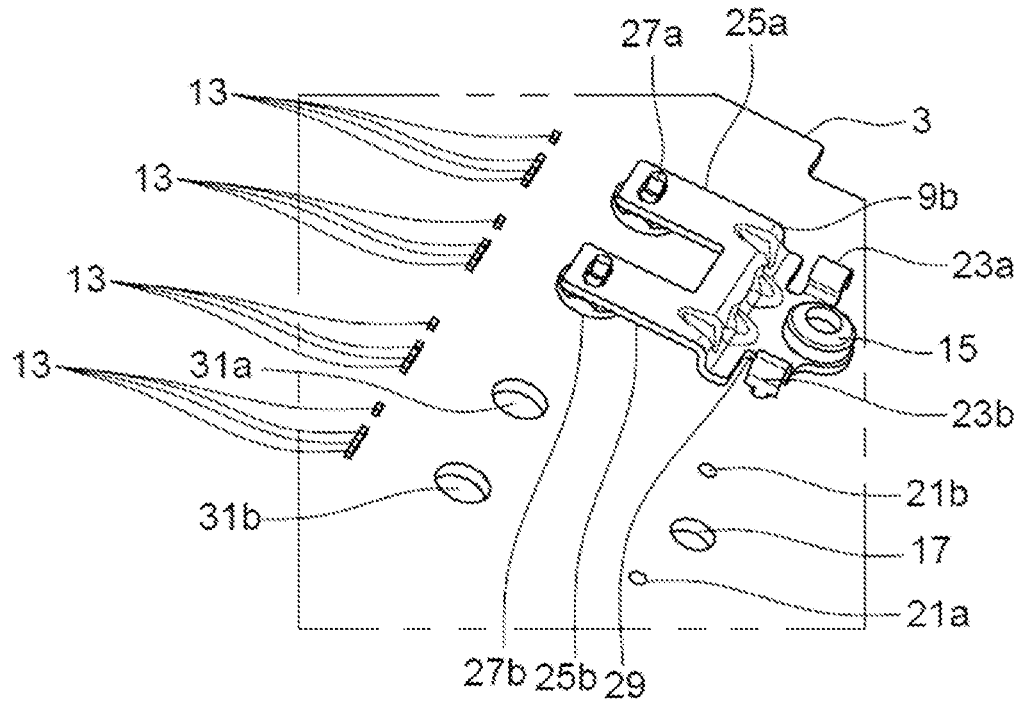

[Fig. 5]
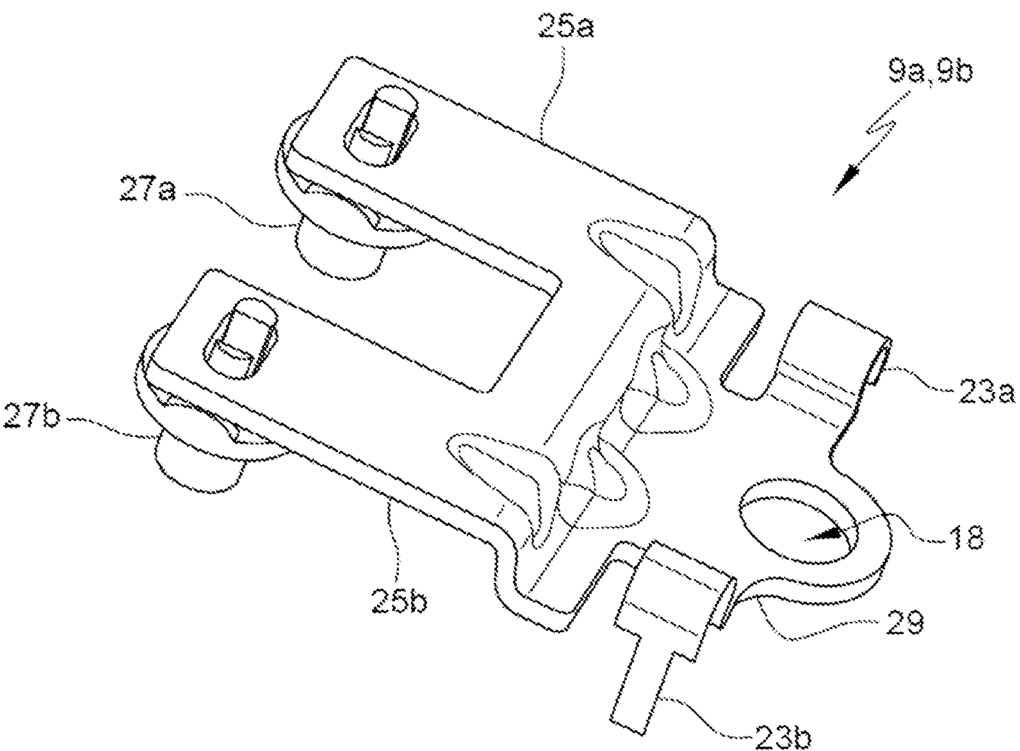
[Fig. 6]
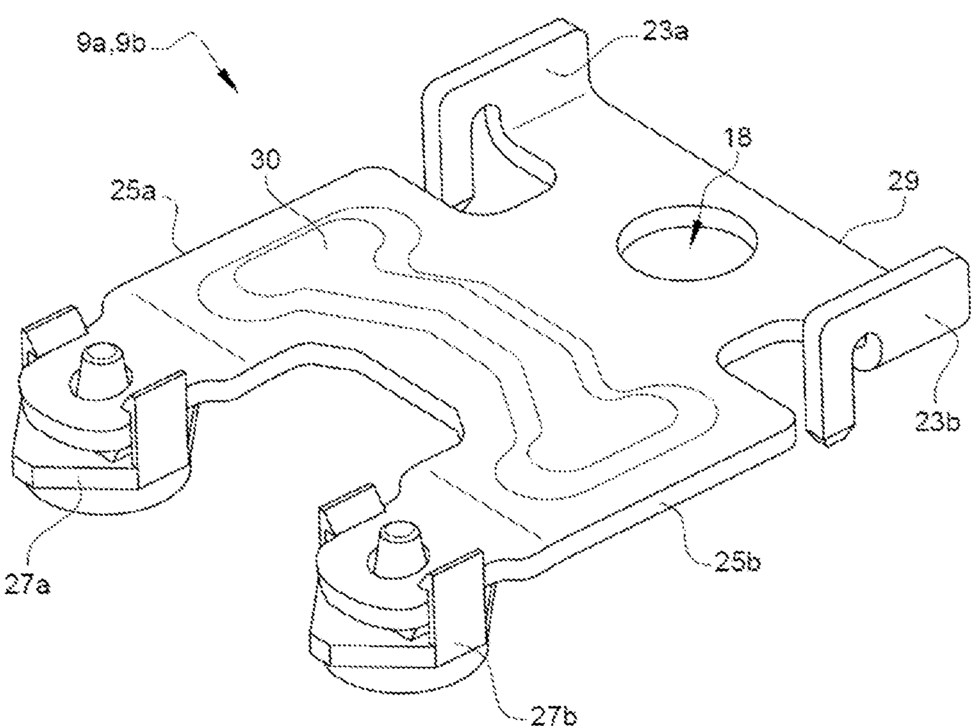

ELECTRICAL EQUIPMENT

BACKGROUND OF THE INVENTION

Field of the Invention

The present invention relates to the field of electrical equipment, notably for vehicles, for example, for electric or hybrid vehicles, and more specifically relates to an item of electrical equipment, notably an electric charger, a voltage converter or an inverter.

The invention is notably aimed at simplifying the assembly of the electrical equipment.

Description of the Related Art

An item of electrical equipment is already known in the prior art that is notably configured to be placed on board a vehicle, for example, with electric or hybrid propulsion, comprising an electronic board and a heat sink. The heat sink is used to dissipate the heat emitted by an electronic component soldered onto the electronic board. The electronic component is disposed orthogonal to the electronic board and is pressed against the heat sink.

However, such an arrangement makes assembly more complex, since it is not always easy to access the electronic board from the heat sink side. In addition, the vertical footprint of such an arrangement, relative to the electronic board, is relatively large.

BRIEF SUMMARY OF THE INVENTION

Notably, the aim of the invention is to obtain an item of electrical equipment with a limited footprint that allows simple assembly in order to thermally connect the electronic component and the heat sink.

To this end, the subject matter of the invention is an item of electrical equipment comprising:

an electronic board; —an electronic component, the electronic component being fixed, notably soldered, onto the electronic board and disposed parallel to the electronic board; —a heat sink, which is configured to dissipate the heat emitted by the electronic component; —a retention member, which supports a bearing element, with the bearing element pressing onto the electronic component in a direction orthogonal to the electronic board and in a direction away from the electronic component relative to the electronic board, the bearing element being configured to press the electronic component onto the heat sink.

Thus, as a result of the arrangement of the electronic component parallel to the electronic board, the footprint of the electrical equipment is limited. In addition, by virtue of this arrangement, due to the fact that the bearing element supported by the retention member presses on the electronic component, the electronic component is simply pressed against the heat sink in a direction orthogonal to the electronic board. The assembly for thermally connecting the electronic component and the heat sink is thus simple to produce.

Further optional features of the electrical equipment, taken alone or in combination, are mentioned hereafter:

The electronic component is a transistor or a diode.

The electronic component comprises a plurality of pins, which are only disposed on one side of the electronic component, and are bent and soldered onto the electronic board.

The electronic component comprises between two and five pins.

The electronic component comprises a chip integrated into a plastic support.

The electronic component complies with TO-247F, JEDEC August 2022.

The retention member is disposed on a face of the electronic board opposite the face on which the electronic component is disposed. Thus, assembly is facilitated, since the retention member can be installed without the risk of damaging the electronic component disposed on the other face of the electronic board.

The retention member is made of metal, preferably stainless steel. Thus, the retention member is robust and inexpensive.

The retention member assumes a half-slot shape, so that one end of the retention member supporting the bearing element is remote from the electronic board, with the other end of the retention member being supported by the electronic board. Thus, assembly is facilitated. As an alternative embodiment, the retention member assumes an essentially flat shape that can have a boss. This boss can be obtained, for example, by stamping the retention member during the manufacturing process, and can make the retention member more rigid. In this alternative embodiment, the entire retention member is supported by the electronic board.

The bearing element is a pin. Thus, the bearing element is produced in a particularly simple manner.

The retention member is fixed onto the heat sink, preferably by screwing by means of a fixing screw. Thus, the relative positioning of the heat sink and of the retention member is facilitated by the fact that the retention member is fixed onto the heat sink.

The retention member is supported by the electronic board. Thus, positioning of the retention member is facilitated, as it is supported by the electronic board.

The retention member is screwed onto the heat sink by means of a fixing screw, with the fixing screw passing through a hole in the electronic board so as to hold the retention member, the electronic board and the heat sink together. Thus, positioning and fixing are facilitated.

The electronic board comprises means for positioning the retention member, preferably the electronic board comprising a hole receiving a tab for positioning the retention member. Thus, assembly is facilitated as positioning the retention member on the electronic board is facilitated.

The bearing element passes through the electronic board and presses directly onto the electronic component. Thus, assembly is facilitated as the retention member and the bearing element can be installed without the risk of damaging the electronic component disposed on the other face of the electronic board. In addition, the equipment is particularly compact.

The bearing element is snap-fitted onto the retention member or is overmoulded onto the retention member. Thus, assembly is facilitated.

The bearing element is made of a thermoplastic material. Thus, the bearing element is produced simply and economically.

The bearing element and the retention member form a single part, preferably made of plastic and/or metal. Thus, assembly is facilitated.

The heat sink is made of metal, preferably aluminium-based. The use of aluminium is advantageous due to its lightness and its ability to be recycled.

The electrical equipment comprises an additional electronic component, with the additional electronic component being fixed, notably soldered, onto the electronic board and disposed parallel to the electronic board, and the retention member supports an additional bearing element, the additional bearing element pressing onto the additional electronic component in a direction orthogonal to the electronic board and in a direction away from the additional electronic component relative to the electronic board, the additional bearing element being configured to press the additional electronic component onto the heat sink. Thus, assembly is simplified, as a single retention member is required for both the electronic component and the additional electronic component.

The electronic component and the additional electronic component are identical. Thus, manufacturing is facilitated by reducing the number of different components.

The bearing element and the additional bearing element are identical. Thus, manufacturing is facilitated by reducing the number of different components.

The retention member is in the form of a fork, with a first branch of the fork supporting the bearing element, a second branch of the fork supporting the additional bearing element, a section of the fork being supported by the electronic board. Thus, assembly is simplified, as a single retention member is produced in a particularly simple manner for both the electronic component and the additional electronic component, and the relative positioning of the bearing elements is simplified.

A fork is generally in the form of a section, forming a first free end, and two branches forming two other free ends of the shape originating in the same zone of the section, with the two branches not being symmetrical relative to the zone of the section from which they originate.

This retention member can be in one piece or can be formed by several parts directly adjacent to each other.

The electrical equipment is configured to be placed on board a vehicle.

The electrical equipment is configured to be placed on board a vehicle, and forms:

a DC-DC converter configured to convert a voltage between a high-voltage power supply battery and a low-voltage power supply battery; or —an electric charger configured to convert a voltage between an electric network outside the vehicle and a power supply battery of the vehicle; or —an inverter configured so as to power an electric motor driving the vehicle from a power supply battery, the inverter being configured to convert direct current supplied by the power supply battery into alternating current for powering the electric motor, and vice versa.

The electrical equipment forming an inverter is installed, for example, with a rotary electric machine comprising a rotor and a stator. Advantageously, the rotary electric machine can form an alternator, an alternator-starter, a reversible machine or an electric motor.

The alternating current is, for example, a single-phase or three-phase current.

The low voltage ranges between 5 and 50 volts, and is preferably equal to 12 or 48 volts.

The high voltage ranges between 220 and 1,500 volts, and is preferably equal to 400 or 800 volts.

BRIEF DESCRIPTION OF THE FIGURES

The invention will be better understood upon reading the following description, which is provided solely by way of an example and with reference to the appended drawings, in which:

FIG. 1 is a schematic cross-section view of an item of electrical equipment according to one embodiment of the invention;

FIG. 2 is a schematic top perspective view of part of an item of electrical equipment shown in FIG. 1;

FIG. 3 is a schematic bottom perspective view of part of an item of electrical equipment shown in FIG. 1;

FIG. 4 is a schematic bottom perspective view of part of an item of electrical equipment shown in FIG. 1, in which some elements are not shown in order to reveal some features of the electrical equipment;

FIG. 5 is a schematic perspective view of a retention member of an item of electrical equipment shown in FIG. 1.

FIG. 6 is a schematic perspective view of an alternative embodiment of the retention member of an item of electrical equipment shown in FIG. 5.

In these figures, similar elements are designated using identical reference signs.

DETAILED DESCRIPTION

The following embodiments are examples. Although the description refers to one or more embodiments, this does not necessarily mean that each reference relates to the same embodiment, or that the features apply only to one embodiment. Individual features of various embodiments also can be combined or interchanged in order to provide other embodiments.

In the description, certain elements can be indexed, for example, first element or second element. In this case, the indexing is simply used to differentiate and denote elements that are similar but not identical. This indexing does not imply that one element takes priority over another and such numbering can easily be interchanged without departing from the scope of the present description. This indexing also does not imply an order in time.

FIG. 1 shows a partial cross-section of an item of electrical equipment according to one embodiment, designated using the general reference 1.

The electrical equipment 1 shown as a cross-section in FIG. 1 comprises an electronic board 3, at least one electronic component 5*a* soldered onto the electronic board 3 and disposed parallel to the electronic board 3, a heat sink 7 and at least one retention member 9*a*.

In this example, the electrical equipment 1 also comprises at least one additional electronic component 11*a* soldered onto the electronic board 3 and disposed parallel to the electronic board 3. In this example, said at least one additional electronic component 11*a* is identical to said at least one electronic component 5*a*. More specifically in this example, the electronic equipment 1 comprises two electronic components 5*a*, 5*b* and two additional electronic components 11*a*, 11*b*, all identical and notably shown in FIG. 2, and two identical retention members 9*a*, 9*b*, which are notably shown in FIG. 3. The electronic board 3 conventionally comprises other electrical or electronic components, which are not shown in the figures.

The heat sink 7 is configured to dissipate the heat emitted by the electronic component 5*a*, 5*b*, and is configured to dissipate the heat emitted by the additional electronic component 11*a*, 11*b*. For example, the heat sink 7 is made of metal, preferably aluminium-based.

In this example, the electronic component 5*a*, 5*b* comprises a plurality of pins 13, which are only disposed on one side of the electronic component 5*a*, 5*b*, and are bent and soldered onto the electronic board 3. For example, the electronic component 5*a*, 5*b* comprises between two and five pins, in this example four pins 13. Furthermore, the electronic component 5*a*, 5*b* comprises a chip integrated in a plastic support, and complies, for example, with standard TO-247F, JEDEC August 2022. For example, the electronic component 5*a*, 5*b* is a transistor or a diode.

In this example, the additional electronic component 11*a*, 11*b* comprises a plurality of pins 13, which are only disposed on one side of the electronic component 11*a*, 11*b*, and are bent and soldered onto the electronic board 3. For example, the additional electronic component 11*a*, 11*b* comprises between two and five pins, in this example four pins 13. Furthermore, the additional electronic component 11*a*, 11*b* comprises a chip integrated in a plastic support, and complies, for example, with standard TO-247F, JEDEC August 2022. For example, the additional electronic component 11*a*, 11*b* is a transistor or a diode. Thus, in this example, the additional electronic component 11*a*, 11*b* is identical to the electronic component 5*a*, 5*b*.

For example, the assembly of electronic components 5*a*, 5*b* and of additional electronic components 11*a*, 11*b* forms a voltage rectifier bridge for converting the alternating voltage generated by phases of a stator into a direct voltage and/or, conversely, for converting a direct voltage into an alternating voltage for powering the phases of the stator.

The retention member 9*a*, 9*b* is supported by the electronic board 3. More specifically, the retention member 9*a*, 9*b* is disposed on a face of the electronic board 3 opposite the face on which the electronic component 5*a*, 5*b* is disposed. Furthermore, in this example, the retention member 9*a*, 9*b* is fixed onto the heat sink 7, preferably by screwing by means of a fixing screw 15. Thus, in this example, the retention member 9*a*, 9*b* is screwed onto the heat sink 7 by means of a fixing screw 15, with the fixing screw 15 passing through a hole 17 in the electronic board 3, shown in FIG. 4, in which the retention member 9*a* is deliberately not shown, so as to hold together the retention member 9*a*, 9*b*, the electronic board 3 and the heat sink 7. In this example, the fixing screw 15 also passes through a hole 18 in the retention member 9*a*, 9*b*, shown in FIG. 5.

For example, the electronic board 3 is screwed onto the heat sink 7 by means of a fixing screw 19, with the fixing screw 19 passing through a hole 20 in the electronic board 3.

In this example, the electronic board 3 comprises means for positioning the retention member 9*a*, 9*b*. For example, the electronic board 3 comprises a hole 21*a*, 21*b* receiving a tab 23*a*, 23*b* for positioning the retention member 9*a*, 9*b*. More specifically in this example, the retention member 9*a*, 9*b* comprises two positioning tabs 23*a*, 23*b*, with the electronic board 3 thus comprising two holes 21*a*, 21*b* for each retention member 9*a*, 9*b*, each hole 21*a*, 21*b* receiving a positioning tab 23*a*, 23*b*.

In this example, the retention member 9*a*, 9*b* is made of metal, preferably stainless steel. The retention member 9*a*, 9*b* is in the form of a fork. The fork is in the form of a section 29, forming a first free end 31, and two branches 25*a*, 25*b* forming two other free ends 32*a*, 32*b* originating from the same zone 33 of the section, with the two branches 25*a*, 25*b* not being symmetrical relative to the zone 33 of the section 29 from which they originate.

When viewed from above, the fork can be U-shaped with a tail originating from the back of the U. The section 29 can then form the tail and the back of the U and each branch 25*a*, 25*b* of the fork forms a branch of the U. The tail and the branches of the U are aligned in this case.

The first branch 25*a* of the fork supports a bearing element 27*a*, the second branch 25*b* of the fork supports an additional bearing element 27*b*, and the section 29 of the fork is supported by the electronic board 3. In this example, the bearing element 27*a* and the additional bearing element 27*b* are identical and are disposed in a similar manner.

In addition, the retention member 9*a*, 9*b* shown in FIGS. 1 to 5 assumes the shape of a half-slot. Thus, one end of the retention member 9*a*, 9*b* supporting the bearing element 27*a*, and the additional bearing element 27*b*, is remote from the electronic board 3, with the other end of the retention member 9*a*, 9*b* being supported by the electronic board 3.

In an alternative embodiment shown in FIG. 6, the retention member 9*a*, 9*b* has an essentially flat surface. In the example shown in FIG. 6, the retention member has a boss 30, extending between the two branches 25*a* and 25*b*, passing through the zone of the section 29 from which the two branches 25*a* 25*b* originate.

Thus, the retention member 9*a*, 9*b* supports a bearing element 27*a*, with the bearing element 27*a* pressing onto the electronic component 5*a*, 5*b* in a direction orthogonal to the electronic board 3 and in a direction away from the electronic component 5*a*, 5*b* relative to the electronic board 3, as shown in FIG. 1 by the arrow A. The bearing element 27*a* is configured to press the electronic component 5*a*, 5*b* onto the heat sink 7. To this end, the bearing element 27*a* passes through the electronic board 3, for example, via a hole 31*a* in the electronic board, and presses directly onto the electronic component 5*a*, 5*b*. In this example, the bearing element 27*a* is a pin. For example, as is notably shown in FIG. 5, the bearing element 27*a* is snap-fitted onto the retention member 9*a*, 9*b*. For example, the bearing element 27*a* is made of a thermoplastic material. According to an alternative embodiment, the bearing element 27*a* is overmoulded onto the retention member 9*a*, 9*b*. According to another alternative embodiment, the bearing element 27*a* and the retention member 9*a*, 9*b* form a single piece, preferably made of plastic and/or metal.

Similarly, the retention member 9*a*, 9*b* supports an additional bearing element 27*b*, the additional bearing element 27*b* pressing onto the additional electronic component 11*a*, 11*b* in a direction orthogonal to the electronic board 3 and in a direction away from the additional electronic component 11*a*, 11*b* relative to the electronic board 3. The additional bearing element 27*b* is configured to press the additional electronic component 11*a*, 11*b* onto the heat sink 7. To this end, the additional bearing element 27*b* passes through the electronic board 3, for example, via a hole 31*b* in the electronic board, and presses directly onto the additional electronic component 11*a*, 11*b*. For example, the additional bearing element 27*b* is snap-fitted onto the retention member 9*a*, 9*b*. In this example, the additional bearing element 27*b* is a pin. For example, the additional bearing element 27*b* is made of a thermoplastic material. According to an alternative embodiment, the bearing element 27*b* is overmoulded onto the retention member 9*a*, 9*b*. According to another alternative embodiment, the additional bearing element 27*b* and the retention member 9*a*, 9*b* form a single piece, preferably made of plastic and/or metal.

An item of electrical equipment 1 as previously described is configured to be placed on board a vehicle, and forms:

- a DC-DC converter configured to convert a voltage between a high-voltage power supply battery and a low-voltage power supply battery; or —an electric charger configured to convert a voltage between an electric network outside the vehicle and a power supply battery of the vehicle; or —an inverter configured so as to power an electric motor driving the vehicle from a power supply battery, the inverter being configured to convert direct current supplied by the power supply battery into alternating current for powering the electric motor, and vice versa.

The alternating current is, for example, a single-phase or three-phase current. The low voltage ranges between 5 and 50 volts, and is preferably equal to 12 or 48 volts. The high voltage ranges between 220 and 1,500 Volts, and is preferably equal to 400 or 800 volts.

For example, the electrical equipment 1 forming an inverter is mounted in a rotary electric machine comprising a rotor and a stator. Advantageously, the rotary electric machine can form an alternator, an alternator-starter, a reversible machine or an electric motor.

The invention is not limited to the embodiments described, and further embodiments will become clearly apparent to a person skilled in the art. Notably, it is possible to combine the embodiments and alternative embodiments described above.

The invention claimed is:

1. An electrical equipment, comprising:

an electronic board;

an electronic component, the electronic component being fixed onto the electronic board and disposed parallel to the electronic board;

an additional electronic component, the additional electronic component being fixed onto the electronic board and disposed parallel to the electronic board;

a heat sink, which is configured to dissipate heat emitted by the electronic component; and a retention member, which supports a bearing element and an additional bearing element, the bearing element and the additional bearing element pressing onto the electronic component and the additional electronic component respectively in a direction orthogonal to the electronic board and in a direction away from the electronic component relative to the electronic board, the bearing elements being configured to press the electronic components onto the heat sink, the retention member being fork-shaped, a first branch of the fork supporting the bearing element, a second branch of the fork supporting the additional bearing element, a section of the fork being supported by the electronic board, the bearing element and the retention member being two distinct parts, and the bearing element being a pin.

2. The electrical equipment according to claim 1, wherein the retention member has a flat surface, the retention member being supported by the electronic board.

3. The electrical equipment according to claim 1, wherein the retention member is disposed on a face of the electronic board opposite a face on which the electronic component is disposed.

4. The electrical equipment according to claim 1, wherein the retention member is fixed onto the heat sink.

5. The electrical equipment according to claim 1, wherein the retention member is supported by the electronic board.

6. The electrical equipment according to claim 1, wherein the electronic board comprises means for positioning the retention member.

7. The electrical equipment according to claim 1, wherein the bearing element passes through the electronic board and presses directly onto the electronic component.

8. The electrical equipment according to claim 1, wherein the retention member assumes a shape of a half-slot, so that one end of the retention member supporting the bearing element is remote from the electronic board, with the other end of the retention member being supported by the electronic board.

9. The electrical equipment according to claim 1, wherein the retention member has an essentially flat surface, the retention member being supported by the electronic board.

10. The electrical equipment according to claim 1, the retention member being in one piece.

11. The electrical equipment according to claim 1, configured to be placed on board a vehicle, and forming:

a DC-DC converter configured to convert a voltage between a high-voltage power supply battery and a low-voltage power supply battery; or an electric charger configured to convert a voltage between an electrical network outside the vehicle and a power supply battery of the vehicle; or an inverter configured so as to power an electric motor driving the vehicle from a power supply battery, the inverter being configured to convert direct current supplied by the power supply battery into alternating current for powering the electric motor, and vice versa.

12. The electrical equipment according to claim 2, wherein the retention member is disposed on a face of the electronic board opposite a face on which the electronic component is disposed.

13. The electrical equipment according to claim 2, wherein the retention member is fixed onto the heat sink.

14. The electrical equipment according to claim 2, wherein the retention member is supported by the electronic board.

15. The electrical equipment according to claim 2, wherein the electronic board comprises means for positioning the retention member.

16. The electrical equipment according to claim 2, wherein the bearing element passes through the electronic board and presses directly onto the electronic component.

17. The electrical equipment according to claim 2, wherein the retention member assumes a shape of a half-slot, so that one end of the retention member supporting the bearing element is remote from the electronic board, with the other end of the retention member being supported by the electronic board.

18. The electrical equipment according to claim 2, wherein the retention member has a flat surface, the retention member being supported by the electronic board.

19. The electrical equipment according to claim 2, the retention member being in one piece.

20. The electrical equipment according to claim 6, wherein the electronic board comprises a hole receiving a tab for positioning the retention member.

* * * * *